(12) United States Patent
Mahaney et al.

(10) Patent No.: US 8,927,861 B2
(45) Date of Patent: *Jan. 6, 2015

(54) METER BOX COVER

(71) Applicant: Inner-Tite Corp., Holden, MA (US)

(72) Inventors: John C. Mahaney, Spencer, MA (US); Anthony J. Agbay, Spencer, MA (US); Lee Holovnia, Northboro, MA (US)

(73) Assignee: Inner-Tite Corp., Holden, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/140,040

(22) Filed: Dec. 24, 2013

(65) Prior Publication Data

US 2014/0183188 A1 Jul. 3, 2014

Related U.S. Application Data

(63) Continuation-in-part of application No. 13/372,662, filed on Feb. 14, 2012, now Pat. No. 8,697,989.

(60) Provisional application No. 61/442,545, filed on Feb. 14, 2011.

(51) Int. Cl.
*H02G 3/08* (2006.01)
*H02B 1/00* (2006.01)
*G01R 11/04* (2006.01)

(52) U.S. Cl.
CPC . *H02B 1/00* (2013.01); *G01R 11/04* (2013.01)
USPC .............. 174/50; 361/664; 174/539; 439/535

(58) Field of Classification Search
USPC ....... 174/50, 539; 439/535; 248/906; 24/457; 361/659, 664, 672
See application file for complete search history.

(56) References Cited

U.S. PATENT DOCUMENTS 5,834,932 A * 11/1998 May ............................. 324/107
7,176,376 B2 * 2/2007 Stachowiak, Jr. ............... 174/50

* cited by examiner

*Primary Examiner* — Dhirubhai R Patel
(74) *Attorney, Agent, or Firm* — McCormick Paulding & Huber LLP

(57) ABSTRACT

A meter box cover including a first portion that engages an inner surface of an opening in a lid of a meter box to prevent the passage of the cover through the opening and a second portion that extends through the opening and beyond an outermost surface of the opening in the lid of the meter box. The meter cover blocks substantially an entirety of the opening and the second portion prevents the cover from being displaced within the opening.

11 Claims, 20 Drawing Sheets

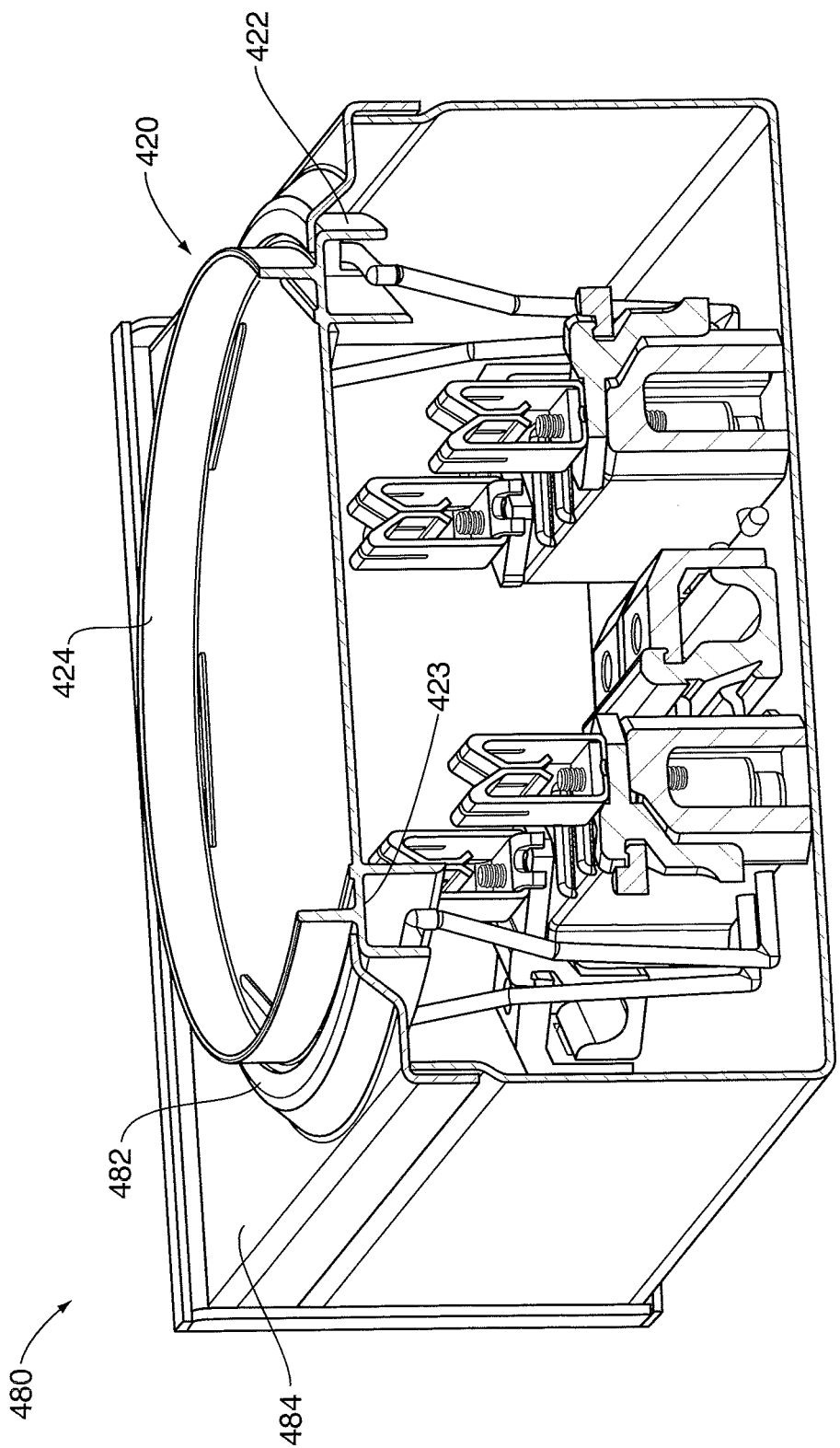

METER BOX COVER

CROSS REFERENCE TO RELATED APPLICATIONS

This application is a continuation in part of U.S. patent application Ser. No. 13/372,662, filed on Feb. 14, 2012, which issued as U.S. Pat. No. 8,697,989 on Apr. 15, 2014, and which claims priority to U.S. Provisional Application No. 61/442,545, filed on Feb. 14, 2011, both of which are hereby incorporated by reference in their entirety.

FIELD OF THE INVENTION

The present invention relates generally to a meter box cover, and more particularly to a tamper resistant meter box cover for preventing unauthorized access to a meter box or similar enclosure.

BACKGROUND OF THE INVENTION

Utility boxes, such as electric meter boxes, are typically rectangular metal structures that include a base portion and a removable lid. The lid includes a central opening through which the meter protrudes. Such boxes are generally secured with a lock to prevent unauthorized access to the meter. Some boxes feature a lockable meter ring, which is placed directly around the lid opening and meter and locked. Other utility boxes, referred to as 'ringless' boxes, do not include a lockable meter ring and are secured by placing a lock on either a side-wall or a bottom wall of the box to prevent the lid from being removed from the base portion.

At certain times, however, the meter may be completely removed from the meter box. As will be readily appreciated, when this occurs it is necessary to block access to the electric terminals that reside within the socket, both to prevent unauthorized use of electricity and to ensure safety. To accomplish this, the central opening in the meter socket lid must be covered or obstructed. Known solutions involve the use of a plastic cover that includes a thin metal plate. While generally effective, such covers do not fit closely within the central opening of the lid and may be pried out of position and removed. Moreover, known covers are not structurally rigid enough to withstand the abuse of an extended period of time in the field.

With the forgoing problems and concerns in mind, it is the general object of the present invention to provide a meter box cover that offers a high degree of tamper resistance and durability and an ease of manufacture.

SUMMARY OF THE INVENTION

It is an object of the present invention to provide a meter box cover.

It is another object of the present invention to provide a tamper resistant meter box cover for a ringless meter socket.

It is another object of the present invention to provide a tamper resistant meter box cover for a ring style meter socket.

An embodiment of the invention is a meter box cover including a first portion that engages an inner surface of an opening in a lid of a meter box to prevent the passage of the cover through the opening and a second portion that extends through the opening and beyond an outermost surface of the opening in the lid of the meter box. The second portion prevents the cover from being displaced within the opening thereby preventing unauthorized access to an interior of the meter box.

Another embodiment of the invention is a meter box cover for a ring-style meter box, the cover including a first portion that is configured to both receive a meter ring and operatively engage a flange on an exterior of a lid of the meter box, the flange defining an opening in the lid and a second portion that blocks an entirety of the opening in the lid. The first portion may be selectively secured to the flange through the use of the meter ring and a lock.

Another embodiment of the invention is a method of manufacturing a meter box cover, the method includes forming a first portion that engages a lid of a meter box to prevent its removal and forming a second portion that blocks substantially the entirety of an opening in the lid. The cover has an axis and the first and second portions are axially displaced from each other.

This and other objectives of the present invention, and their preferred embodiments, shall become clear by consideration of the specification, claims and drawings taken as a whole.

BRIEF DESCRIPTION OF THE DRAWINGS

FIG. 23 is a cut away perspective view of a meter box cover according to an embodiment of the invention mounted on a ring-less meter box.

DETAILED DESCRIPTION OF THE PREFERRED EMBODIMENT

Figure 1:
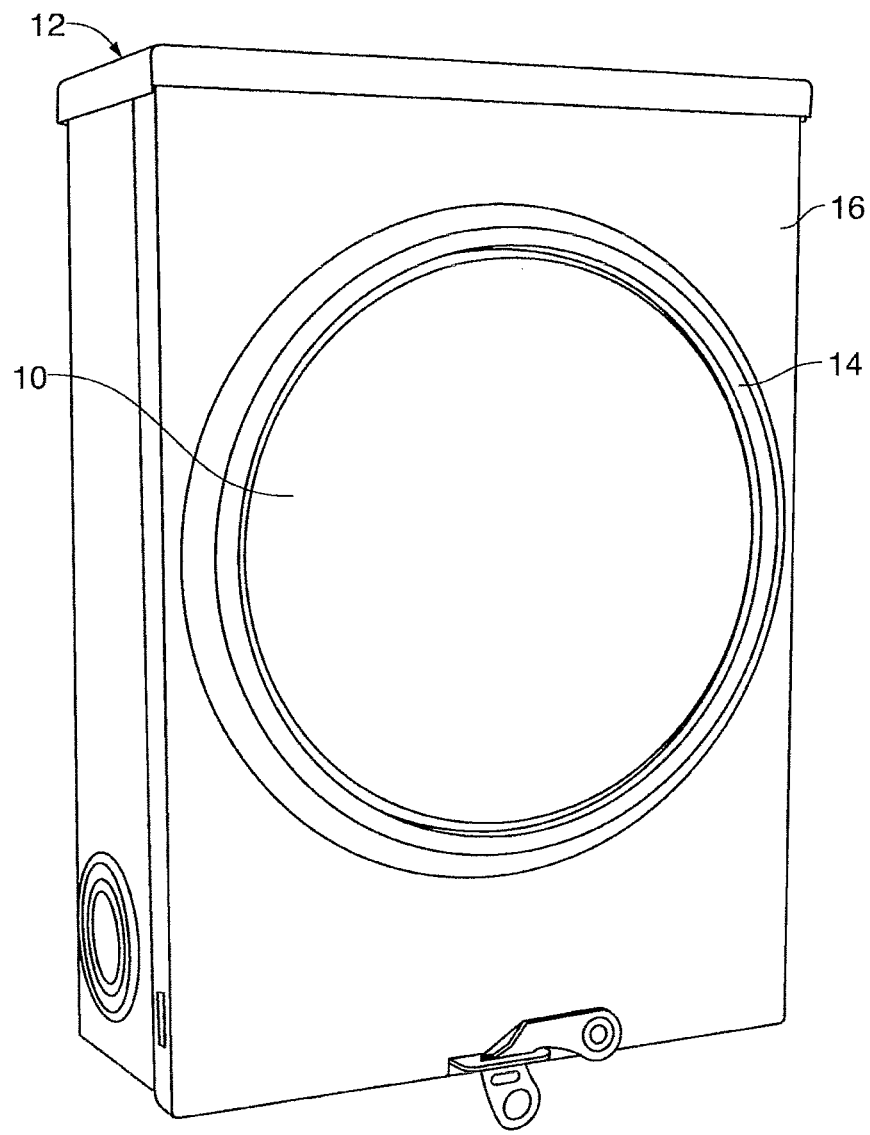
FIG. 1 is a perspective view of a prior art meter box cover mounted on a ringless meter box.
Figure 2:
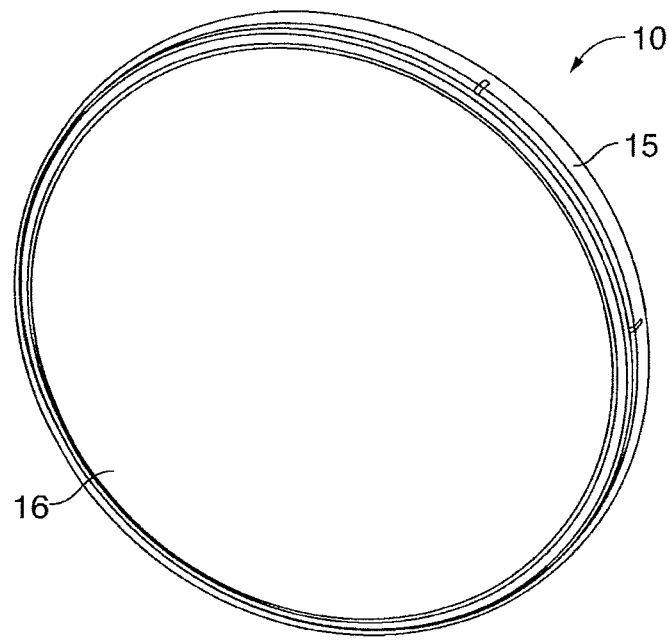
FIG. 2 is a perspective front view of the prior art meter box cover of FIG. 1.
Figure 3:
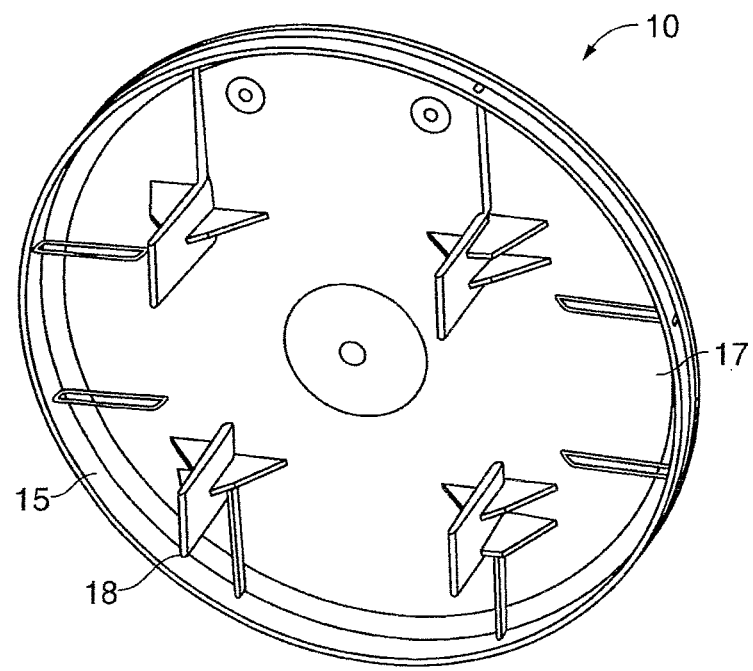
FIG. 3 is a perspective rear view of the prior art meter box cover of FIG. 1.

FIGS. 1-3 are perspective views of a prior art meter box cover 10. In particular, FIG. 1 shows the prior art meter box cover 10 mounted on a ringless meter box 12. As shown, the cover 10 is substantially flush with the lip 14 of the central opening in the box lid 16 when installed. Moreover, the cover 10 does not fit particularly closely within the extended lip 14 that defines the opening of the lid 16 and does not extend beyond the boundary of the opening in the interior of the box 12. As such, a potential problem with this design is that the cover 10 may be pried upward or downward relative to the lid opening to gain access to the interior of the box 12 and the electric terminals inside.

Turning now to FIGS. 2 and 3, the prior art box cover 10 is also not particularly robust. Indeed, the two-piece cover 10 features a plastic backing 17 to which a thin metal insert 16 is attached. The plastic backing 17 includes a side wall 15 and series of tabs 18 which, when in use extend into meter socket lugs. The thin tabs 18, however, may be broken both through tampering and through abuse sustained when deployed in the field for an extended period. Moreover, prior art cover is a multi-component structure requiring assembly.

Figure 4:
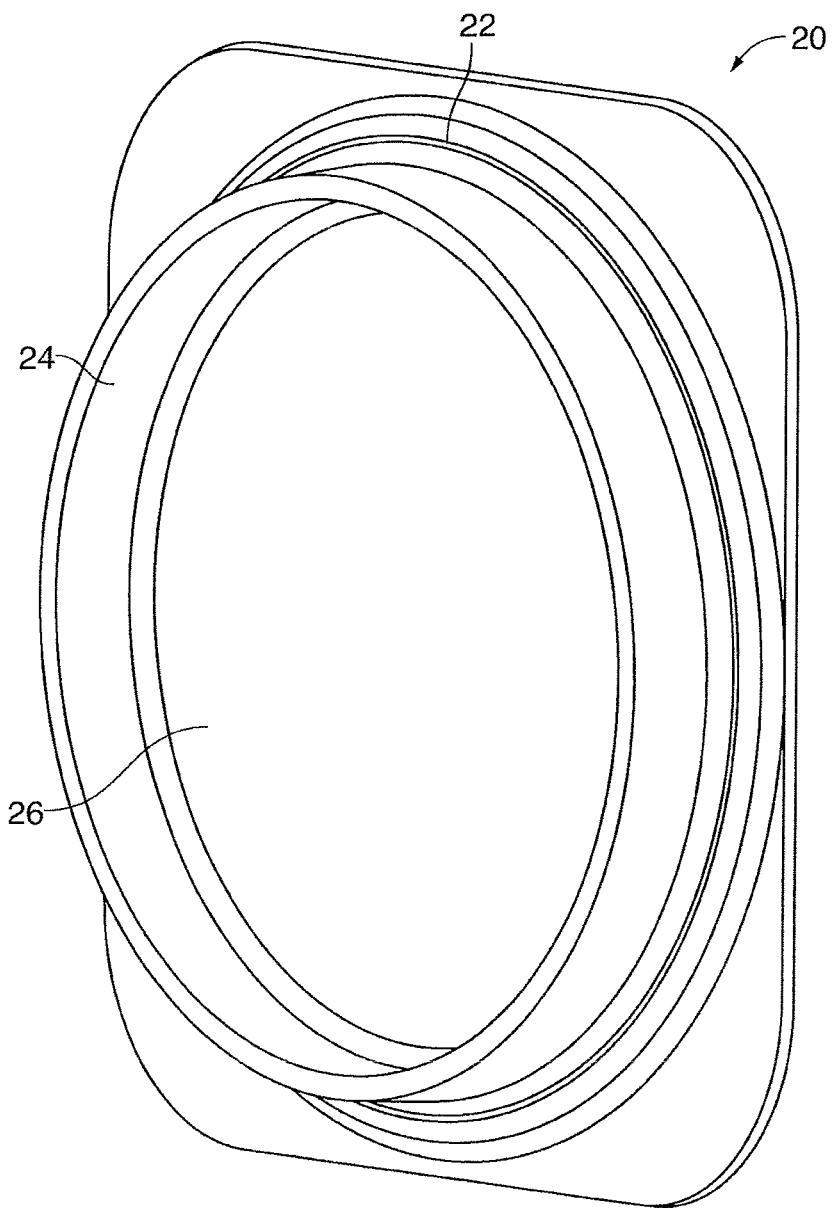
FIG. 4 is a perspective front view of a meter box cover in accordance with an embodiment of the present invention.
Figure 5:
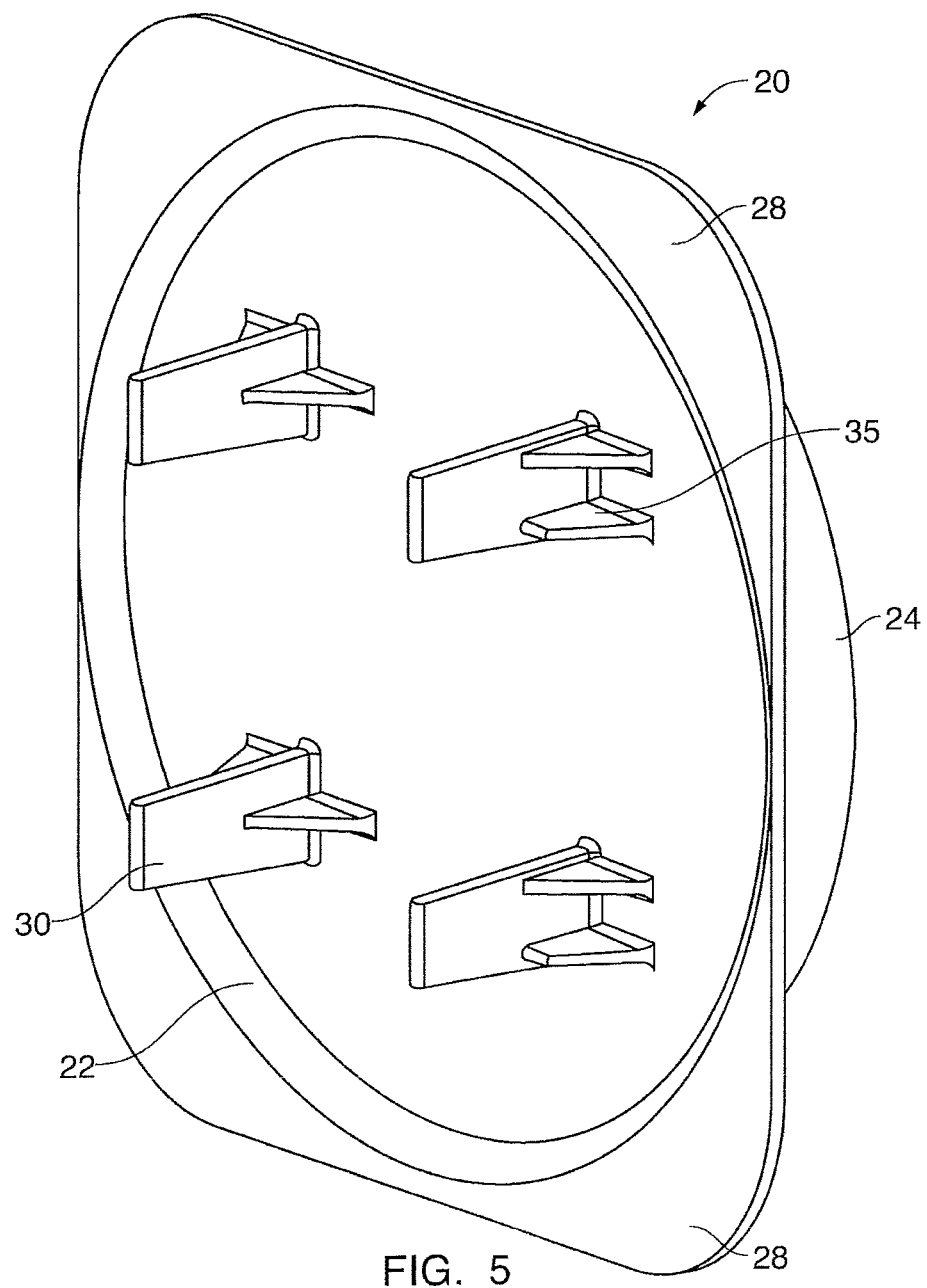
FIG. 5 is a perspective rear view of the meter box cover of FIG. 4.

FIGS. 4 and 5 depict an embodiment of the inventive meter box cover 20. The cover 20 includes a first portion 22 that is configured to engage an interior surface of the cover of the meter box and, in particular, the interior of annular protrusion or boundary that defines the opening through which the meter extends. The cover 20 further includes a second portion 24, here an annular rim, that extends from the first portion 22. The second portion 24 is configured to extend through the opening in the meter box lid. Moreover, the cover 20 includes a substantially flat face portion 26, which blocks substantially an entirety of the opening in the meter box lid so that the interior of the meter box cannot be accessed.

As shown in FIG. 5, a rear view of cover 20, the cover also includes flanges 28 that extend from the first portion 22. The flanges 28 are configured to engage an inner surface of the lid, when the cover is pulled forward, to further prevent the passage of the cover 20 through the opening of the lid and movement of the cover within the opening. In one embodiment, the cover 20 has four flanges 28 giving the cover 20 a substantially rectangular profile.

Figure 6:
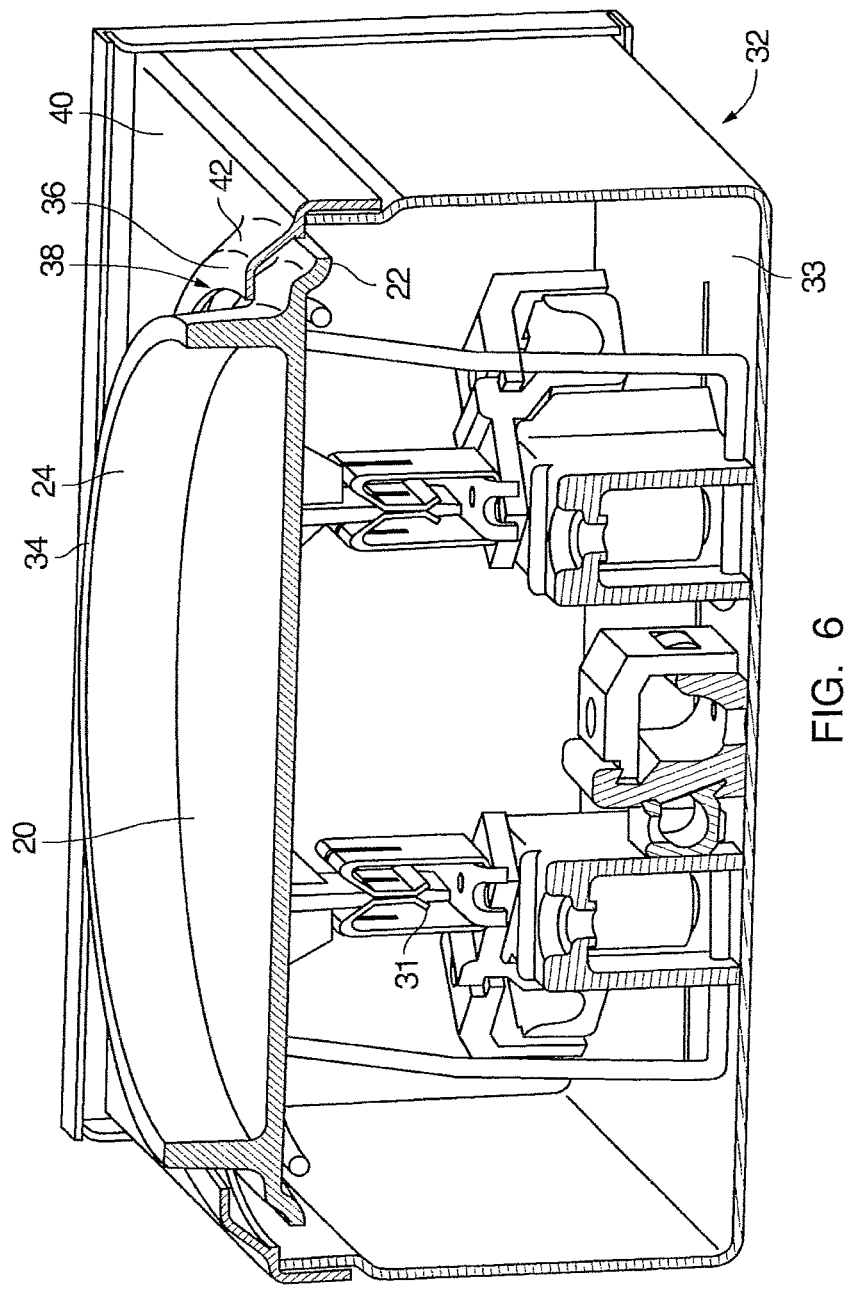
FIG. 6 is a cutaway perspective view of the meter box cover of FIG. 4 mounted on a ringless meter box.
Figure 7:
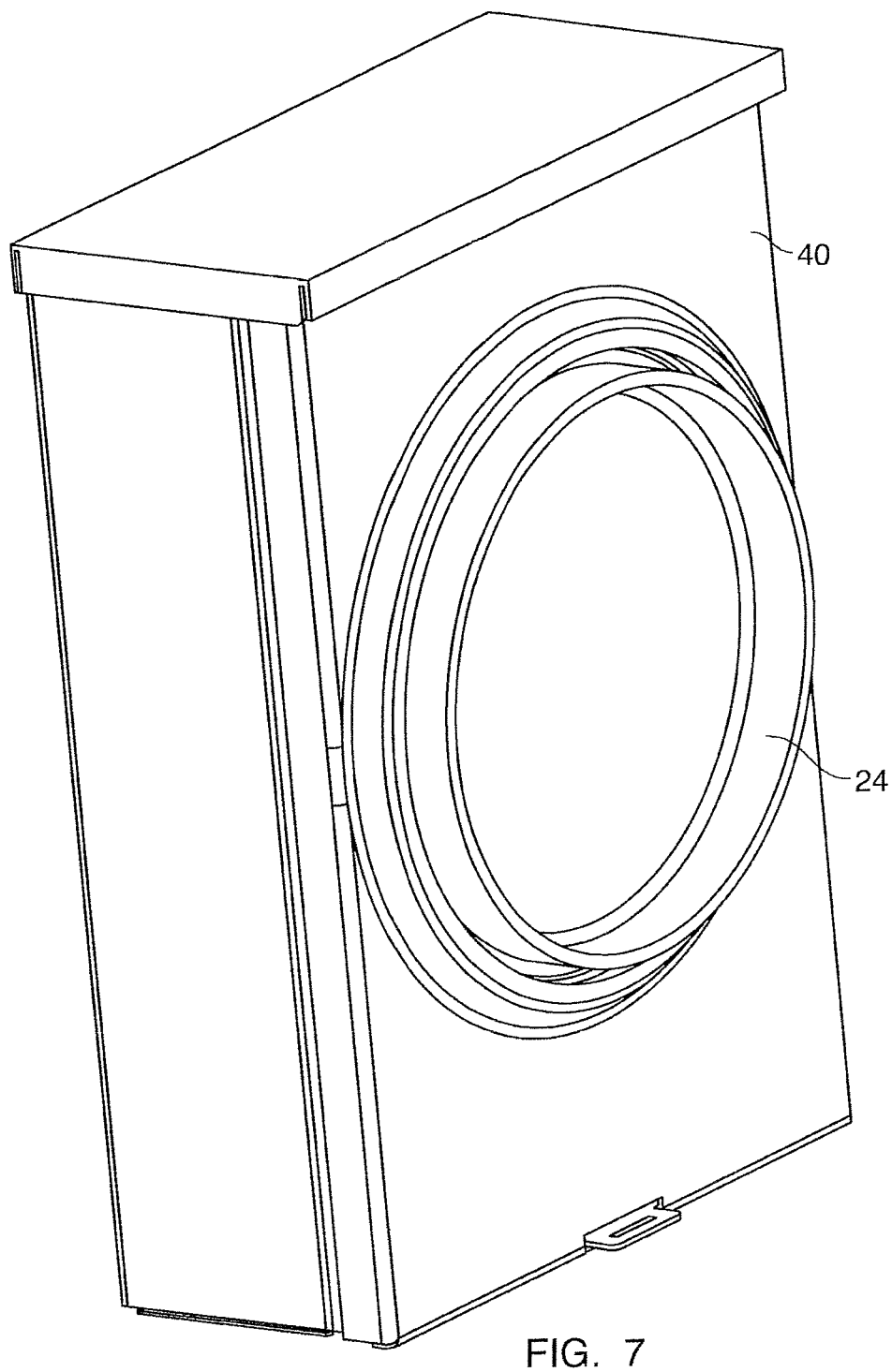
FIG. 7 is a perspective view of the meter box cover and meter box of FIG. 6 depicting a flange of the meter cover protruding from the meter box.

FIG. 5 also depicts four tabs 30 extending from the rear of the face portion. The tabs 30 are configured to extend into meter sockets 31 within the base portion 33 of the meter box (FIG. 6). In particular, the tabs 30 include ribs 35 that impart strength and rigidity to the tabs 30 and also function as a dead stop. That is, the dead stop of the ribs 35 against the interior of the meter socket prevents the cover 20 from being pushed further toward the sockets to potentially access the interior of the box. Similarly, the dead stop alerts an installer to when the cover is in a fully installed position.

Turning now to FIG. 6, the cover 20 is shown mounted within a meter box 32. As depicted, the second portion 24 is an annular rim that has a terminal end portion 34 that extends beyond an outermost surface 36 of the opening 38 in the meter box cover 40. The first portion 22 has a shape that substantially matches the shape of the interior of the rim or annular protrusion 42 that defines the opening 38 in the lid 40. As shown, the first portion 22 may have a stepped or similar shape. As will be appreciated, the first portion 22 and the flange prevent the cover 20 from passing through the opening 38 and from moving within the opening.

Indeed, in use, the extension of the second portion 24 through the opening and the close fit of the first portion 22 within the annular protrusion that defines the opening prevents displacement of the cover 20 in the opening.

Figure 8:
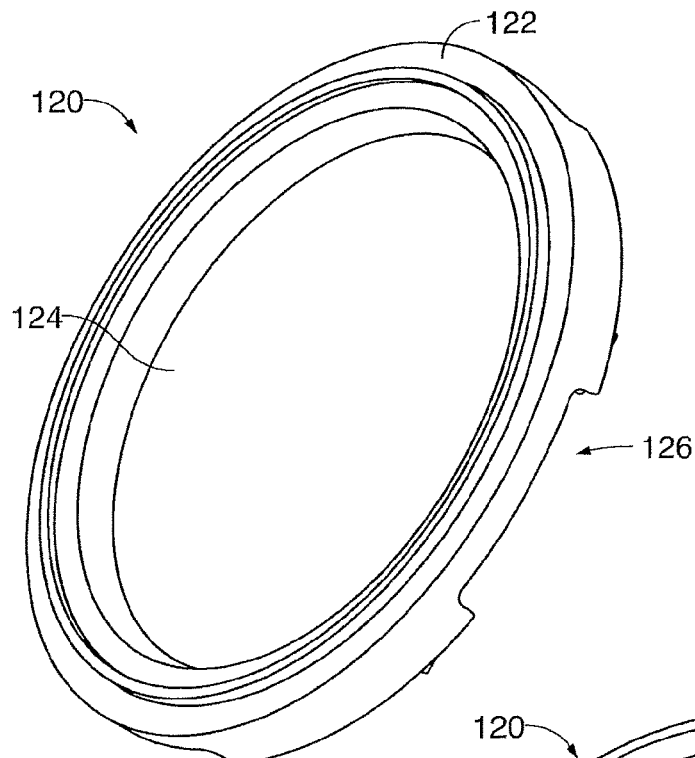
FIG. 8 is a perspective front view of a meter box cover configured for use with a ring style meter box in accordance with an alternative embodiment of the present invention.
Figure 11:
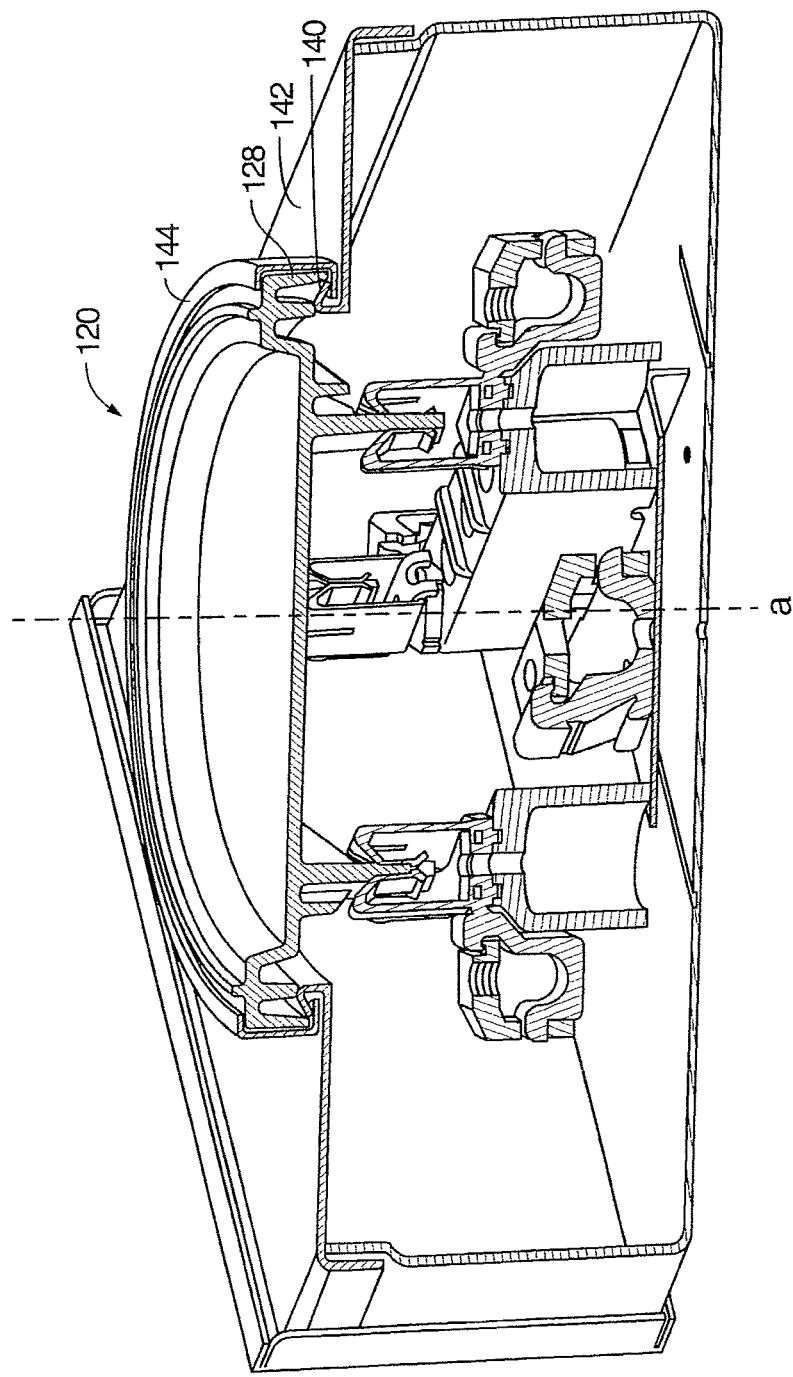
FIG. 11 is a cutaway perspective view of the meter box cover of FIG. 8 installed on a ring style meter box.

Turning now to FIG. 8, an embodiment of the cover 120 may be used with ring style meter boxes. This embodiment includes annular first portion 122 that is configured to receive a meter ring to secure the cover 120 to the meter. The cover 120 further includes a face or second portion 124 that blocks the entirety of the opening of a meter box lid. The second portion is offset, e.g., inset, from the annular first portion 122. In particular, the first portion and second portions are axially offset from one another about a lid opening axis a. (FIG. 11).

As shown, the first portion 122 also includes at least one cut away portion 126 which allows the cover 120 to be gripped and removed once the meter ring has been unlocked and removed.

Figure 9:
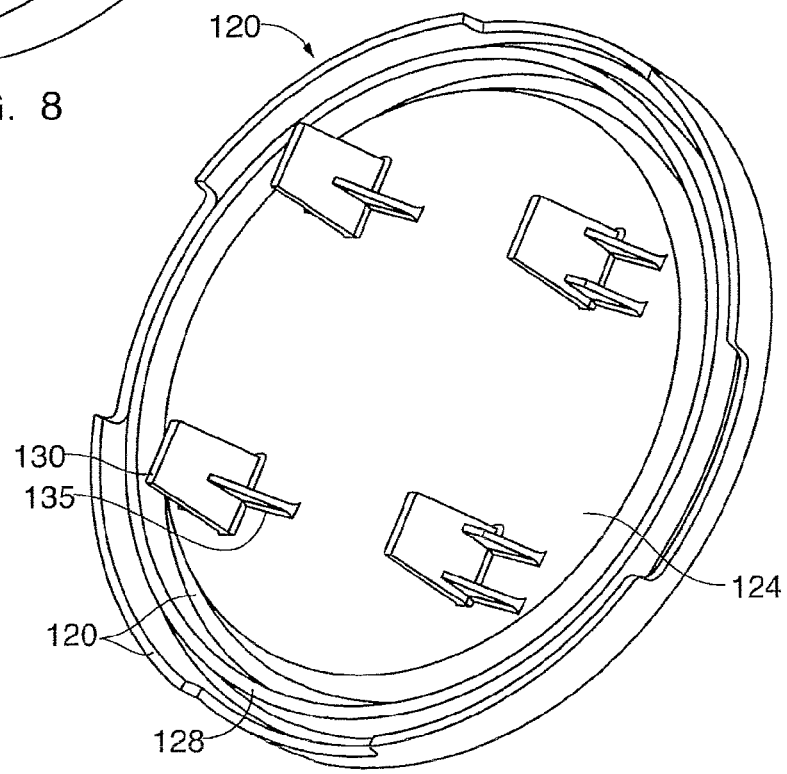
FIG. 9 is a perspective rear view of the meter box cover of FIG. 8.
Figure 10:
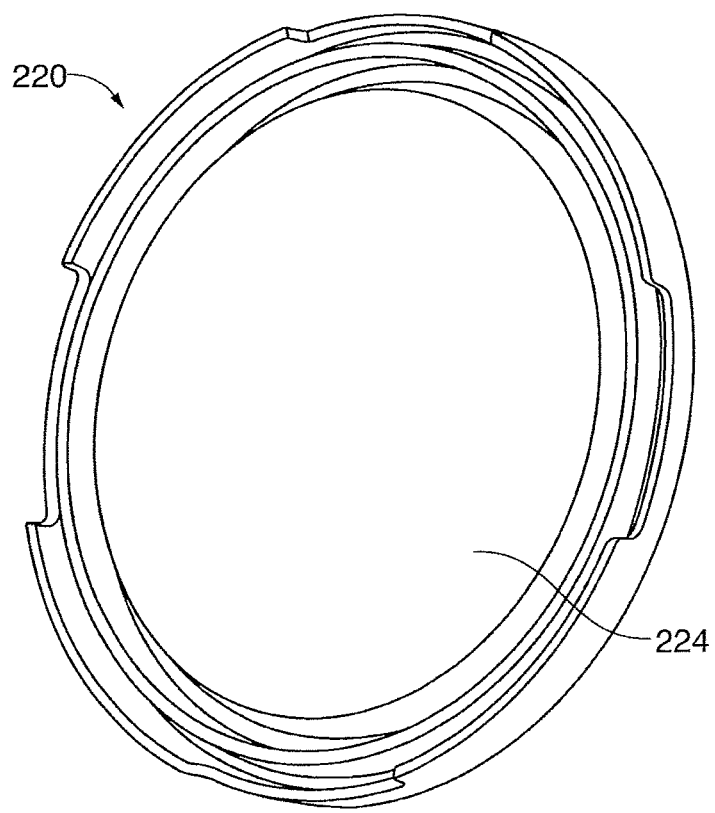
FIG. 10 is a perspective rear view of an alternative embodiment of the meter box cover of FIG. 8.

FIG. 9 depicts a reverse side of the embodiment shown in FIG. 8. As illustrated, the cover 120 includes at least one tab 130, which is structurally reinforced with at least one rib 135. As mentioned above, the ribs 135 can function as a dead stop within a socket. In an embodiment, the cover 120 includes four tabs 130. Alternatively, in other embodiments such as the embodiment shown in FIG. 10, the cover 220 may include no tabs.

Still referring to FIG. 9, the cover 120 also includes an annular ridge 128 that is located within the first portion 122, which, as shown, has a substantially u-shaped profile. The ridge 128 provides structural rigidity to the first portion 120 and serves as a stop against the flange 140 of a ring style meter box lid 142.

Figure 12:
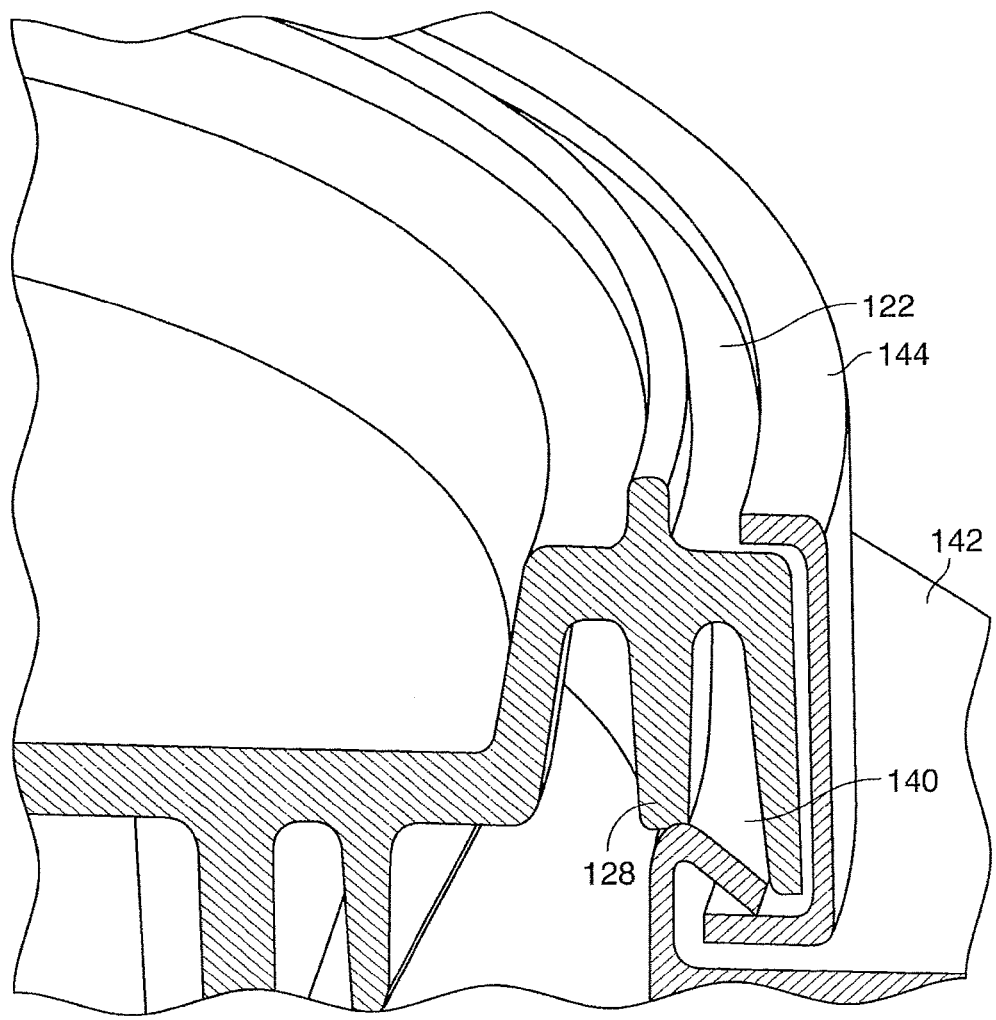
FIG. 12 is a detail perspective view of the meter box cover and box of FIG. 11.

FIGS. 11 and 12, depict the cover 120 secured to a ring style meter box. In particular, the cover 120 is placed over the flange 140 of the lid 142 such that the ridge 128 abuts the flange 140. A locking ring 144 having a substantially u-shaped cross-sectional profile is then placed over the first portion 122 of the cover 120 so that the ring 144 extends under the flange 140 and over the front of the first portion 122. The ring 144 may then be locked in place, preventing removal of the cover 120.

Figure 13:
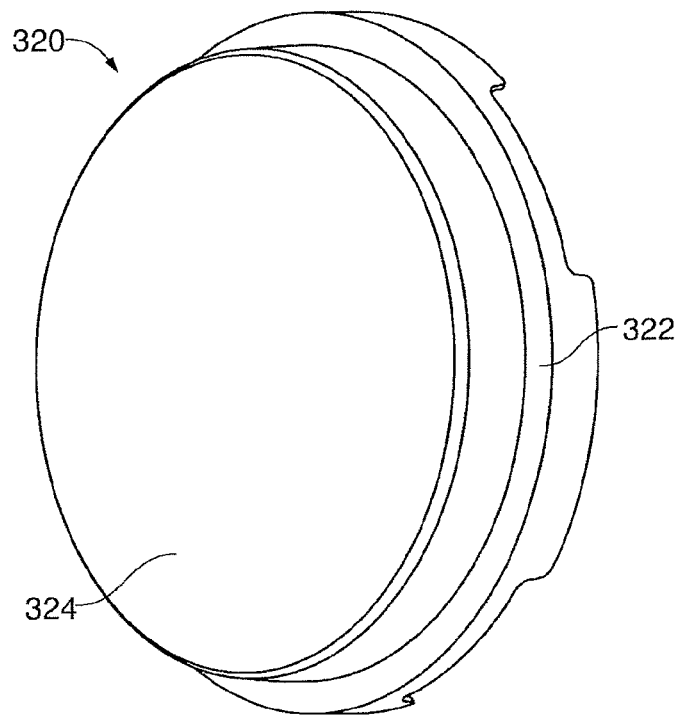
FIGS. 13 and 14 are perspective front and rear views of an alternative embodiment of the meter box cover of FIG. 8.
Figure 14:
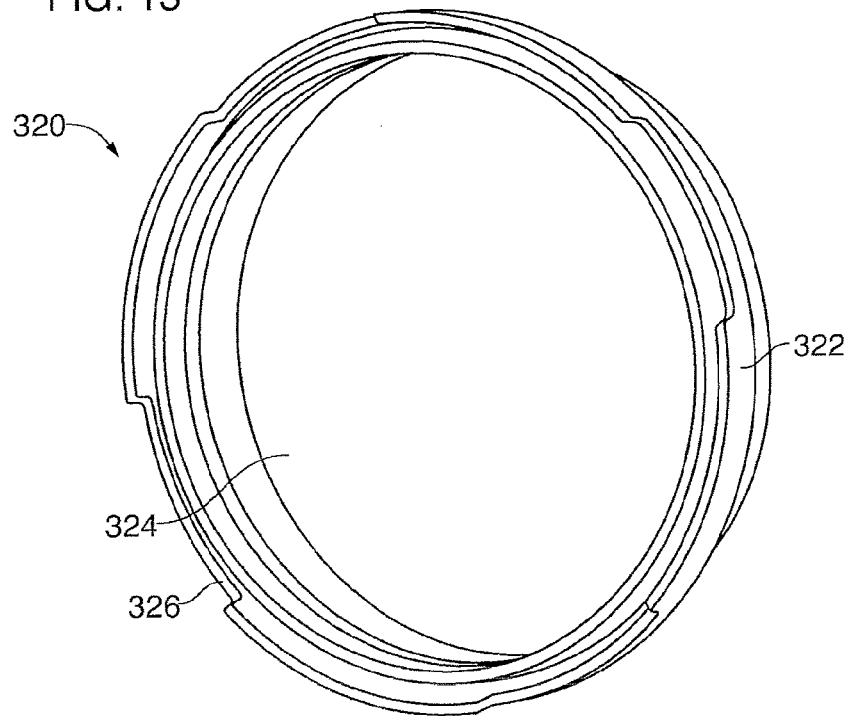
Figure 15:
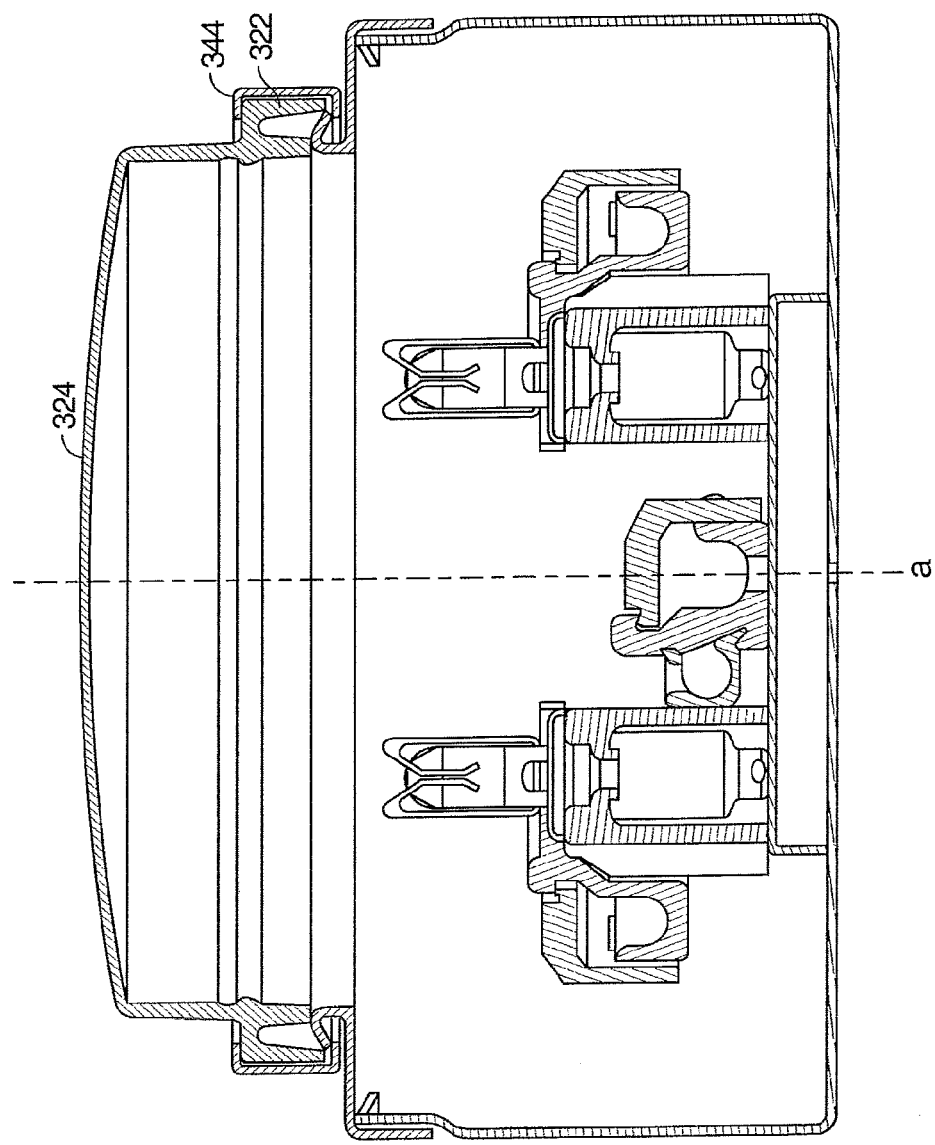
FIG. 15 is a perspective view of the meter box cover of FIGS. 13 and 14 mounted on a meter box.
Figure 16:
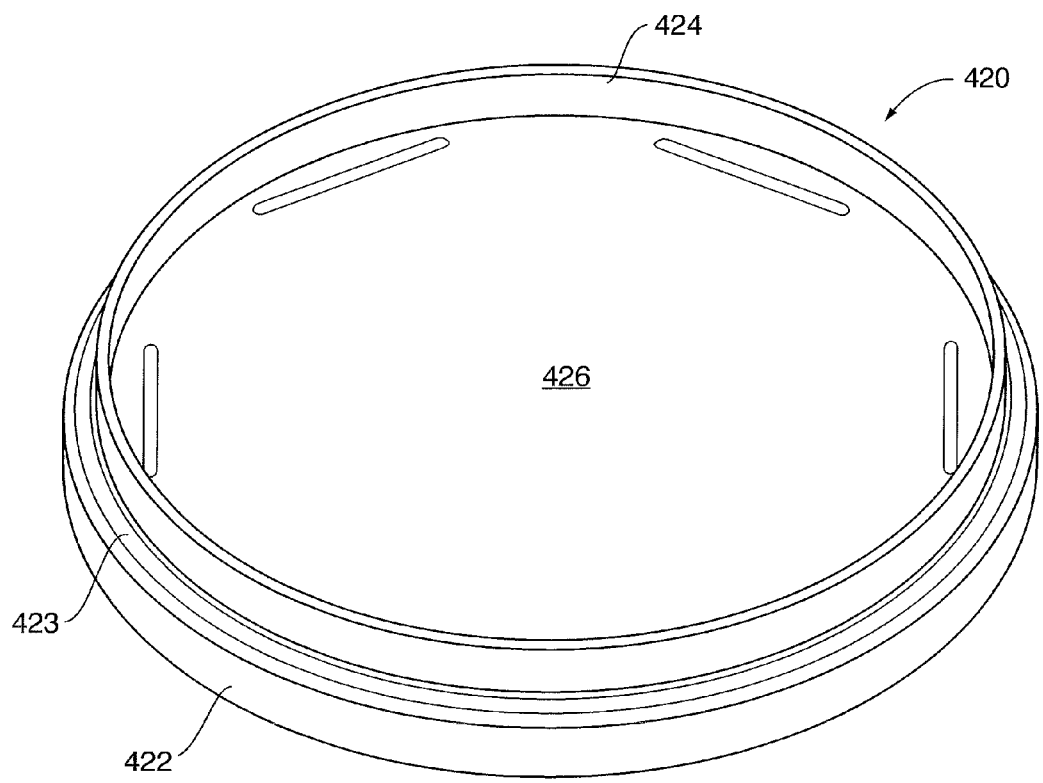
FIG. 16 is a perspective front view of a meter box cover according to another embodiment of the present invention.

Turning now to FIGS. 13-15, another embodiment of the meter cover 320 is shown. This embodiment is also configured for use with a ring-style meter box. As depicted, the cover 320 includes an annular first portion 322 that closely fits over a flange of a meter lid and a face or second portion 324 that blocks the entirety of the opening in the lid defined by the flange. In this embodiment, the second portion 324 is axially offset outward from the first portion 322 about opening axis a. The first portion 322 includes at least one cut away portion 326 to facilitate removal of the cover 320.

As shown in FIG. 15, the second portion 324 has a substantially convex profile. The convex profile adds strength and rigidity to the cover 320. In use, the cover 320 is placed over the flange of the lid. A locking ring 344 having a u-shaped profile is then placed over the first portion 322 of the cover 320 so that the ring 344 extends under the flange and over the front of the first portion 322, and then locked in place.

FIGS. 16-20 depict another embodiment of a meter cover 420 of the present invention that can be used with both ring-style meter boxes and ringless boxes. More specifically, referring to FIG. 16, the meter cover 420 includes an annular first cover portion 422 and a substantially flat face portion 426 which blocks substantially an entirety of the opening in the meter box lid so that the interior of the meter box cannot be accessed. The meter cover 420 further includes an annular rim 424 that protrudes outward from the face portion 426.

Figure 17:
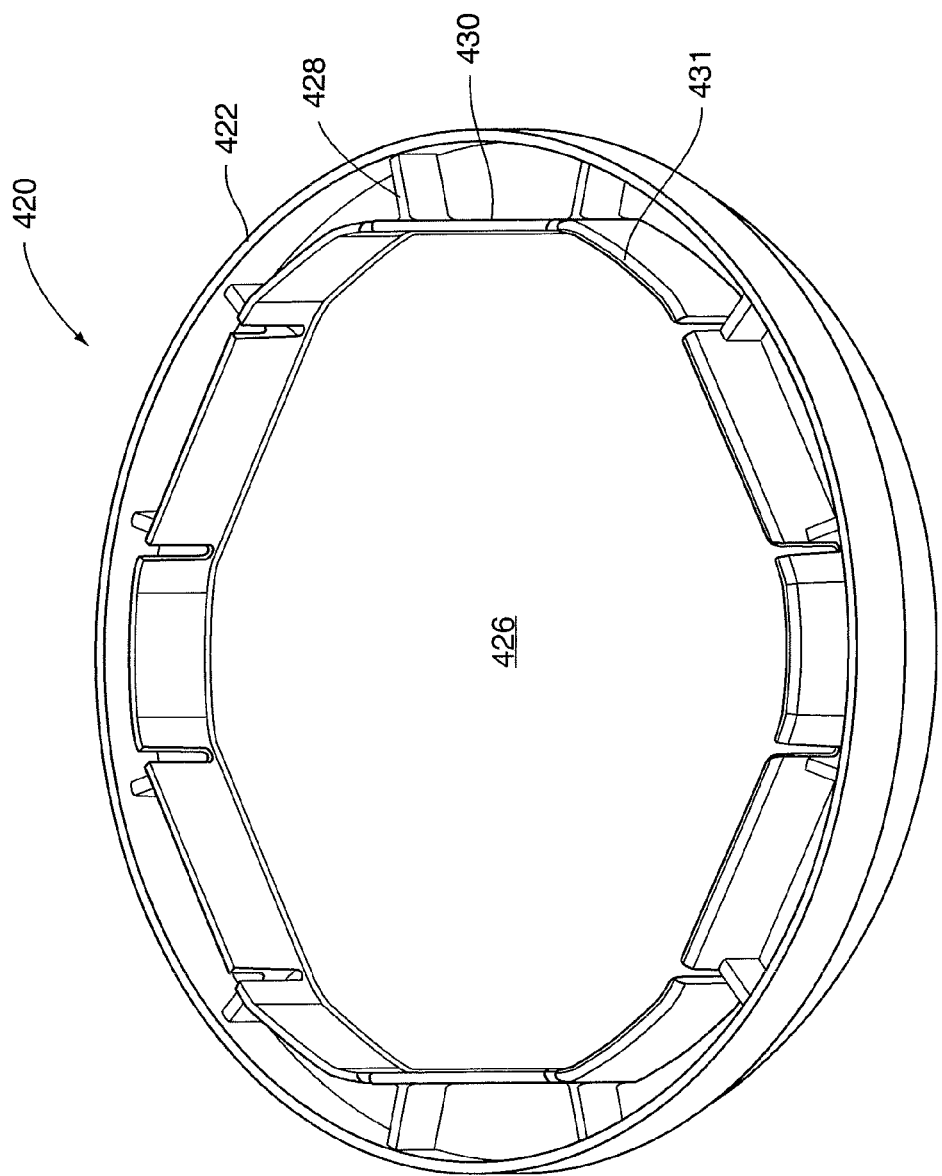
FIG. 17 is a perspective rear view of the meter box cover of FIG. 16.
Figure 18:
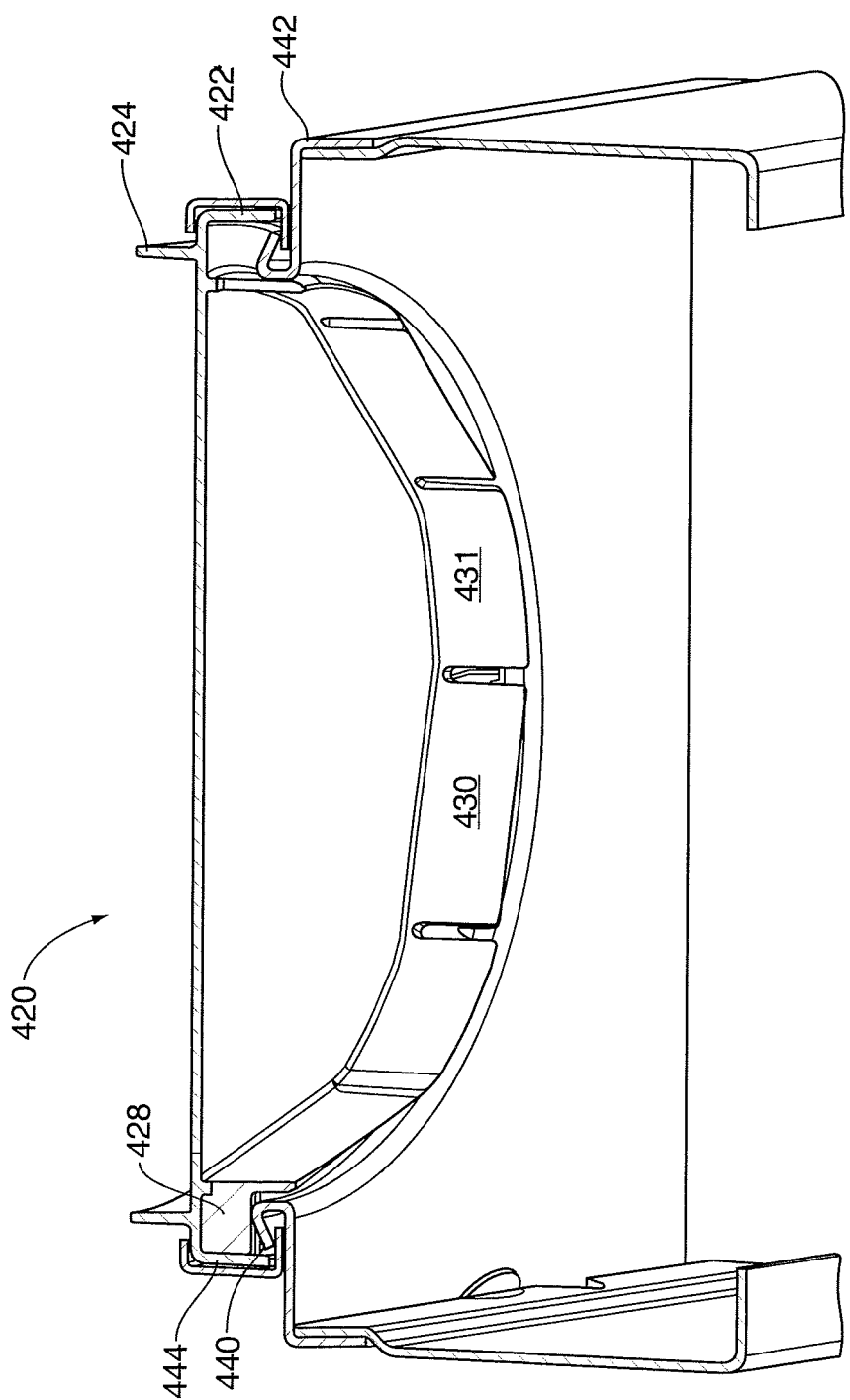
FIG. 18 is a cut away perspective rear view of the meter box cover of FIG. 16 secured to a meter box.
Figure 19:
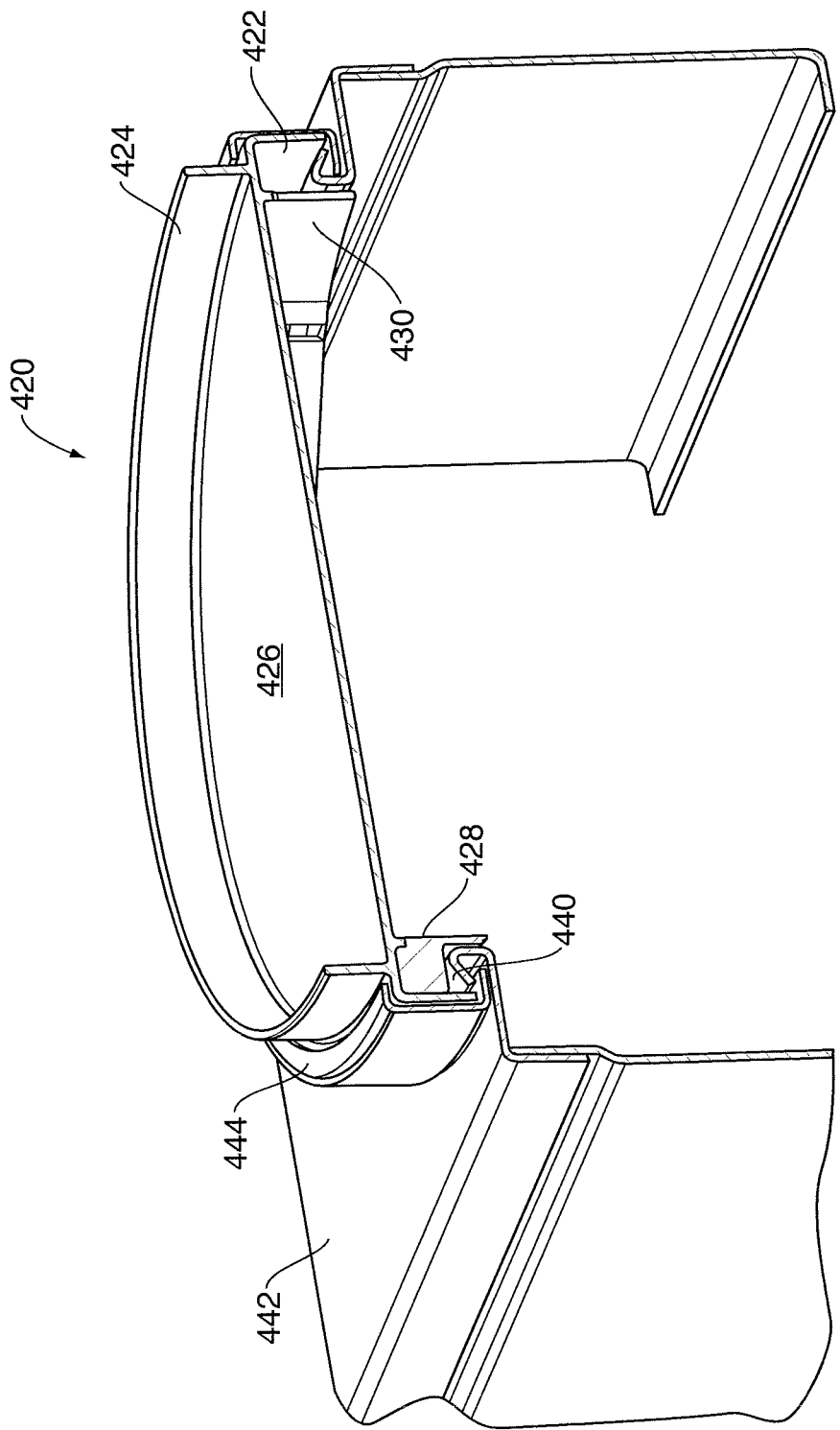
FIG. 19 is another cut away perspective view of the meter box cover of FIG. 16 secured to a meter box.
Figure 20:
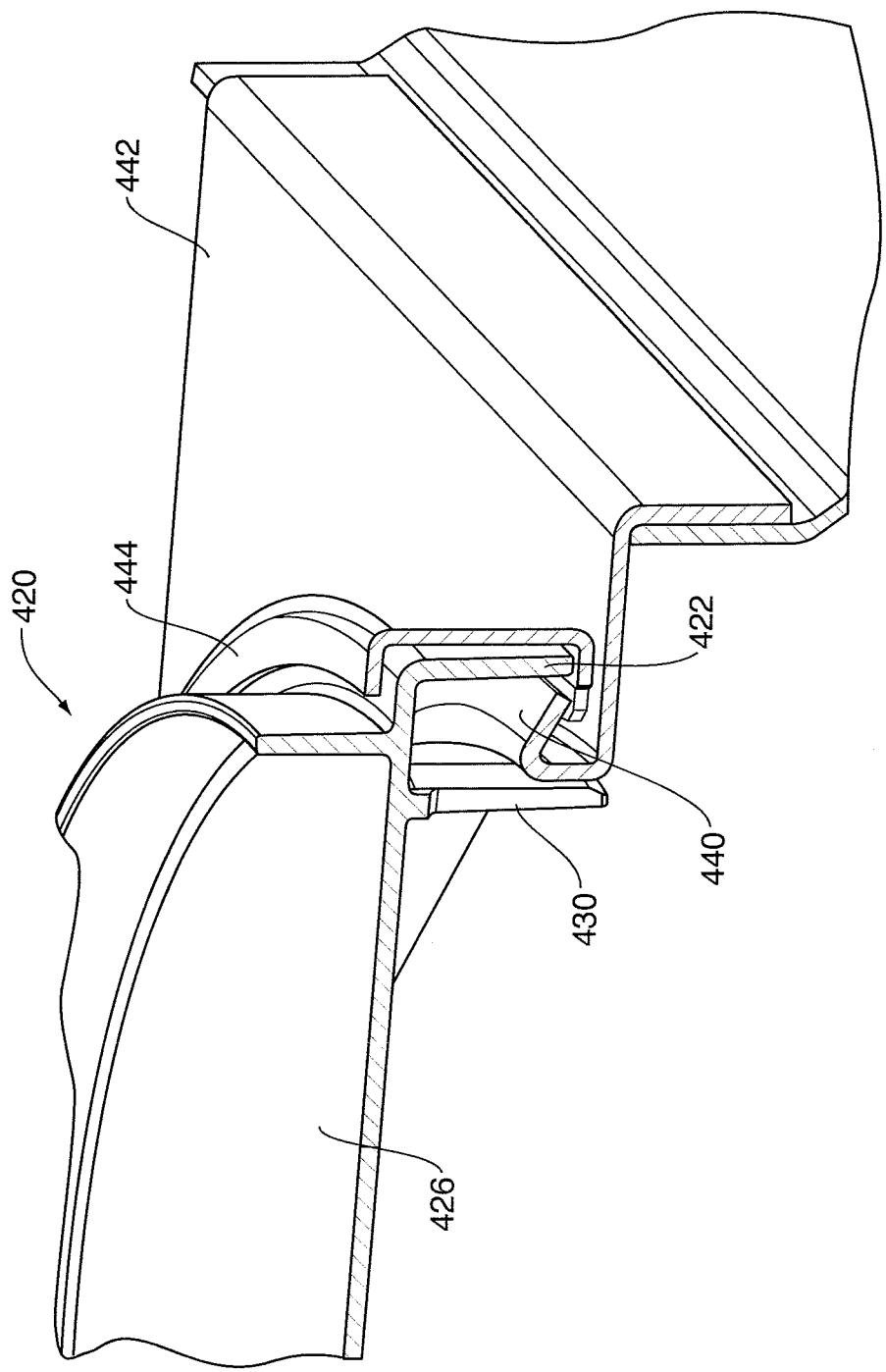
FIG. 20 is an enlarged cut away perspective view of the meter box cover of FIG. 16 secured to a meter box.

Referring to FIG. 17, which illustrates a rear cover surface, the cover 420 further includes a plurality of protrusions 430, 431. Protrusions 431 are flexible, and, in use, contact an inner surface of a flange 440 of a meter box lid 442 (FIGS. 18-20). Protrusions 430 are attached to ribs or stops 428 which render the protrusions 430 inflexible and provide a stop against which the flange 440 rests when it's installed.

In the embodiment depicted in FIGS. 16-20, the protrusions 430, 431 are in a substantially hexagonal arrangement and the ribs or stops 428 extend radially about the circumference of the cover 420 between the protrusions 430 and the annular first cover portion 422.

The hexagonal arrangement includes both protrusions 430, which are substantially flat, inflexible and feature the ribs or stops 428, as well as protrusions 431 which are substantially curved and flexible. In use, the curved protrusions 431 fit snugly within the opening of a meter box cover. The flat protrusions 430 are configured to provide clearance for the latch in a ring-style meter box, which is discussed in greater detail below. It will also be appreciated that various other geometric configurations of protrusions may be employed.

As depicted in FIGS. 18-22, the cover 420 may be secured to a ring-style meter box. In particular, the cover 420 is placed over the flange 440 of the lid 442 of a ring-style box such that the ribs or stops 128 abut the flange 140. The flexible protrusions 431 contact the flange 428 and guide installation of the cover on the same. A locking ring 444 having a substantially u-shaped cross-sectional profile is then placed over the first portion 422 of the cover 420 so that the ring 444 extends under the flange 440 and over the front of the first portion 422. The ring 444 may then be locked in place, preventing removal of the cover 420.

Figure 21:
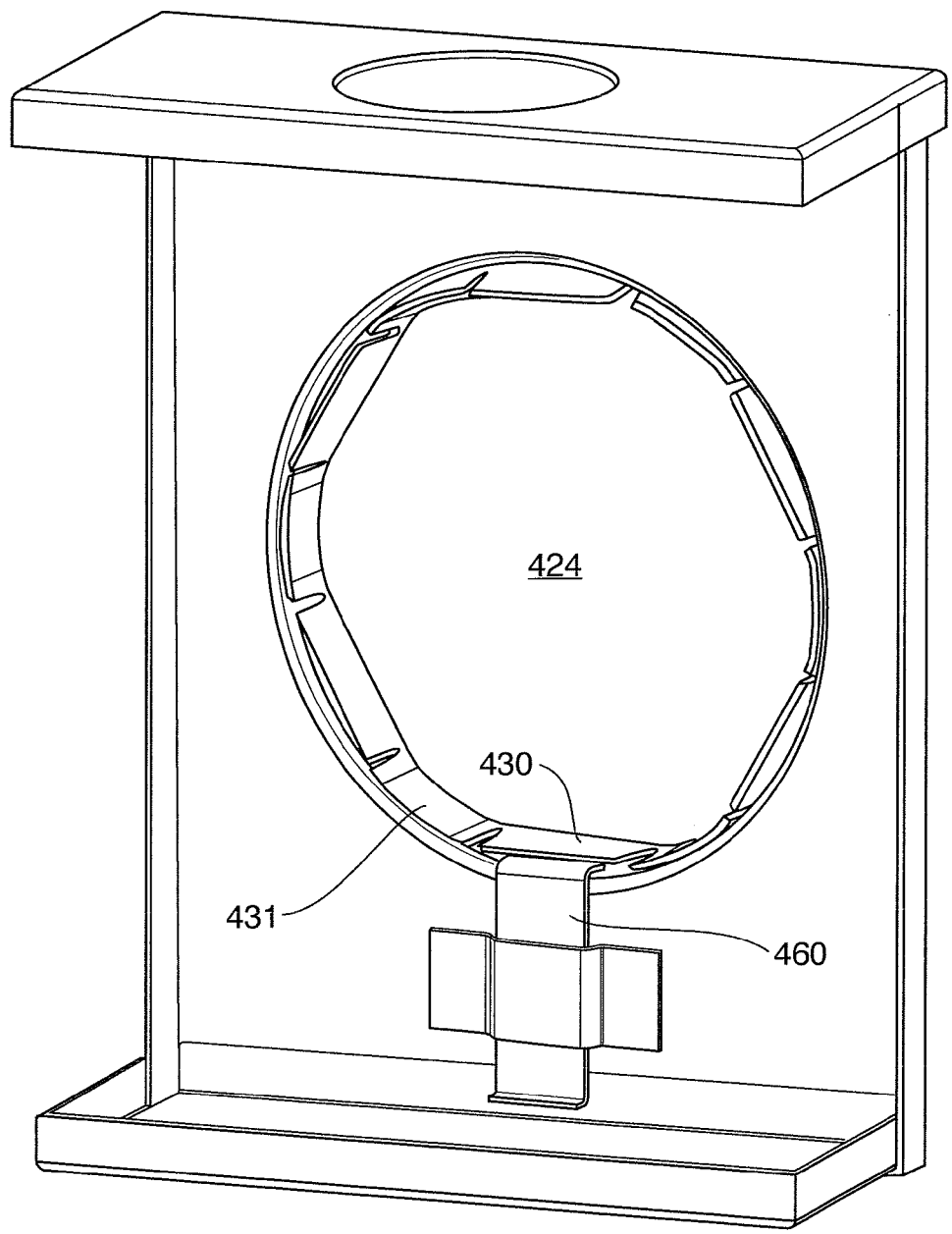
FIG. 21 is a perspective view of a meter box cover secured to a meter box illustrating the position of the cover with respect to a latch of the meter box.
Figure 22:
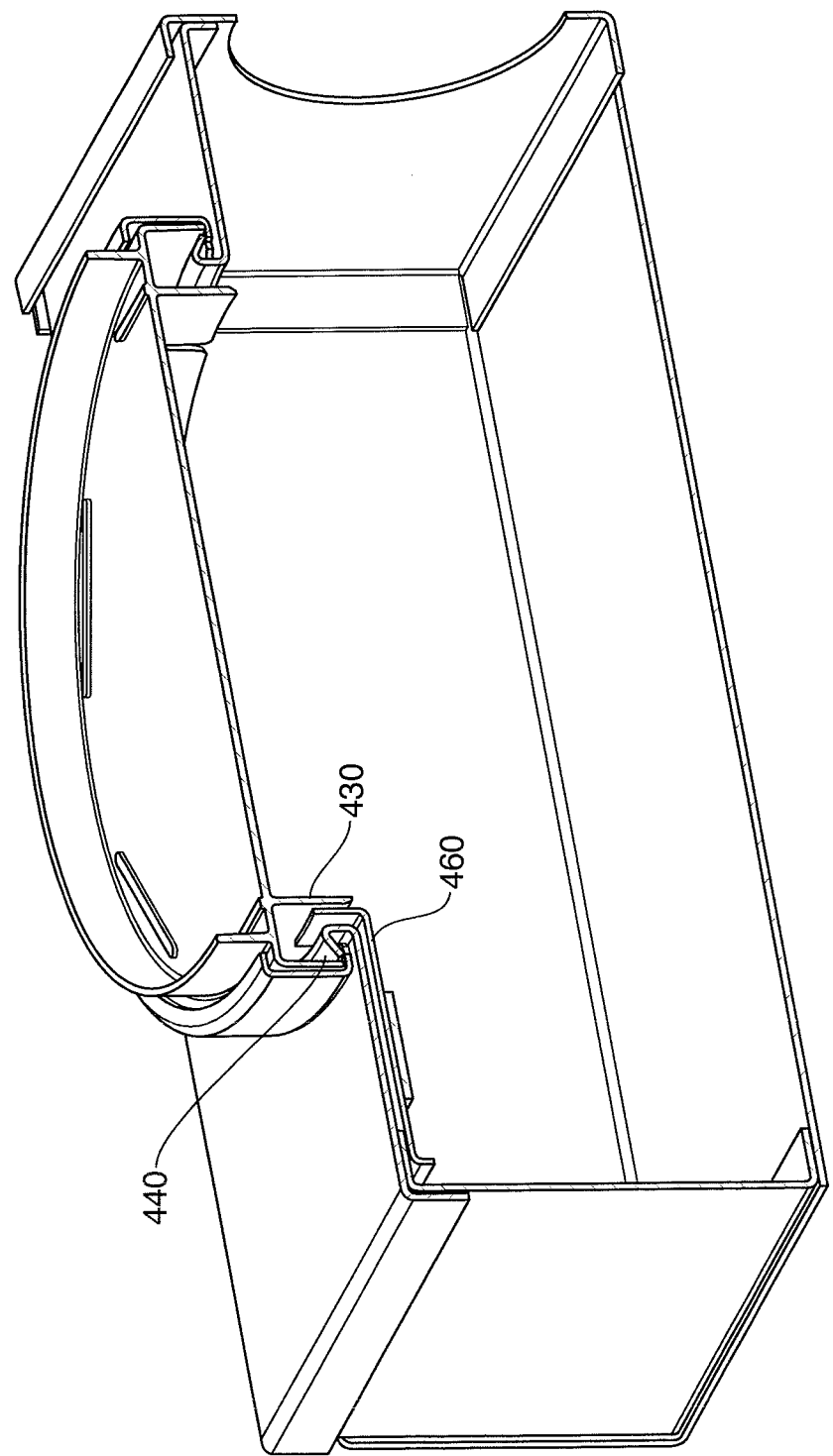
FIG. 22 is a cut away perspective view of a meter box cover depicted the meter box cover latch.

As shown in FIGS. 21 and 22, the flat protrusions 430 are configured to allow for clearance of the latch 460. Indeed, the latch 460 extends between the flange 440 of the meter box and one of the flat protrusions 430.

Referring now to FIG. 23, the cover 420 may also be used with a ringless meter box 480. Here, the cover 420 would be mounted within the ringless meter box 480 such that an outer surface 423 of the annular first portion 422 would contact the annular protrusion 482 that defines the opening in the lid 484 of the ringless box 480. The extension of the annular rim 424 of the cover through the lid opening and the fit of the first portion 422 of the cover within the meter box's annular protrusion 482 that defines the lid opening prevents displacement of the cover 420 in the lid opening and thwarts tampering.

In embodiments of the present invention, the inventive cover is a unitary molded product formed from a relatively thick gauge impact and UV-resistant material such as polycarbonate. The cover may be opaque or may be clear such that the interior of the box may be visualized through the cover. As will be appreciated, however, other suitably durable materials may be employed.

One of ordinary skill in the art will understand that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the invention, including the best mode, and also to enable any person of ordinary skill in the art to practice the embodiments of invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described embodiments, without departing from the spirit and scope of the meter cover herein involved, it is intended that all of the subject matter of the above description or shown in the accompanying drawings shall be interpreted merely as examples illustrating the inventive concept herein and shall not be construed as limiting the invention.

What is claimed is:

1. A meter box cover comprising:
   an annular first portion having an outer surface configured to engage an inner surface of an opening in a lid of a ringless meter box;
   an annular rim that extends through the opening and beyond an outermost surface of the opening; and
   a face portion of the cover that blocks substantially an entirety of the opening in the lid;
   wherein the outer surface of the annular first portion extends outward from the annular rim in a direction generally perpendicular to a direction of extension of the annular rim, the outer surface being configured to contact the inner surface of the opening in the lid to prevent the passage of the cover through the opening in the lid; and
   wherein extension of the annular rim through the opening prevents the cover from being displaced within the opening.

2. The meter box cover of claim 1 further comprising:
   a plurality of flexible protrusions configured to engage an inner surface of a flange of a ring-style meter box cover.

3. The meter box cover of claim 2 wherein the plurality of flexible protrusions are in a substantially hexagonal configuration on the ring-style meter box cover.

4. The meter box cover of claim 2 wherein the meter box cover further comprises a plurality of ribs extending from an inner periphery of the annular first portion to the protrusions.

5. The meter box cover of claim 1 wherein the meter box cover is a unitary molded structure.

6. The meter box cover of claim 1 wherein the meter box cover is manufactured from an impact resistant polymeric material.

7. A meter box cover comprising:
an annular first portion that is configured to both receive a meter ring and operatively engage a flange on an exterior of a lid of a ring-style meter box, the annular first portion having an outer surface, and the flange defining an opening in the lid;
a plurality of flexible protrusions configured to engage an inner surface of the flange, wherein upon installation the flange sits between the annular first portion and the flexible protrusions,
a face portion of the cover that blocks an entirety of the opening in the lid; and
an annular rim that protrudes outward from the face portion of the cover;
wherein the outer surface of the annular first portion extends outward from the annular rim in a direction generally perpendicular to a direction of protrusion of the annular rim from the face portion of the cover, the outer surface being configured to contact an inner surface of a locking ring to prevent removal of the cover from the opening in the lid.

8. The meter box cover of claim 7 wherein the meter box cover further comprises a plurality of ribs extending from an inner periphery of the annular first portion to the protrusions, the ribs providing a stop for the flange.

9. The meter box cover of claim 7 wherein the plurality of flexible protrusions are in a substantially hexagonal configuration on the meter box cover.

10. The meter box cover of claim 7 wherein the annular first portion is further configured to engage an inner surface of the opening in a lid of a ringless meter box to prevent the passage of the meter box cover through the opening in the lid so that the meter box cover may be used with either a ringless meter box or a ring-style box.

11. The meter box cover of claim 10 further comprising:
the annular rim extends through the opening in the lid in the ringless meter box and beyond an outermost surface of the opening in the lid; and
wherein the extension of the annular rim through the opening in the lid prevents the meter box cover from being displaced within the opening in the lid of the ringless meter box.

* * * * *